United States Patent
Levy et al.

(10) Patent No.: US 9,548,349 B2
(45) Date of Patent: Jan. 17, 2017

(54) SEMICONDUCTOR DEVICE WITH METAL EXTRUSION FORMATION

(71) Applicant: International Business Machines Corporation, Armonk, NY (US)

(72) Inventors: Max G. Levy, Essex Junction, VT (US); Gary L. Milo, Milton, VT (US); David C. Thomas, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 14/314,223

(22) Filed: Jun. 25, 2014

(65) Prior Publication Data

US 2015/0380478 A1    Dec. 31, 2015

(51) Int. Cl.
*H01L 27/00*    (2006.01)
*H01L 49/02*    (2006.01)

(52) U.S. Cl.
CPC ................................ *H01L 28/87* (2013.01)

(58) Field of Classification Search
CPC ................. H01L 28/60; H01L 28/87
USPC ........................................................ 438/393
See application file for complete search history.

(56) References Cited

U.S. PATENT DOCUMENTS

| | | | |
|---|---|---|---|
| 5,317,185 A | 5/1994 | Fernandes et al. | |
| 5,356,659 A | 10/1994 | Seshubabu et al. | |
| 6,022,774 A * | 2/2000 | Kawai | H01L 21/76802 |
| | | | 257/E21.008 |
| 6,849,468 B2 * | 2/2005 | Jang | H01L 28/84 |
| | | | 257/E21.009 |
| 6,908,826 B2 * | 6/2005 | Kim | H01L 21/31116 |
| | | | 257/E21.008 |
| 7,078,817 B2 | 7/2006 | Ho et al. | |
| 7,087,516 B2 | 8/2006 | Hau-Riege | |
| 7,161,211 B2 | 1/2007 | Raina et al. | |
| 7,772,702 B2 | 8/2010 | Bielefeld et al. | |
| 8,191,217 B2 | 6/2012 | Dunn et al. | |
| 8,232,646 B2 | 7/2012 | Bonilla et al. | |
| 2003/0008468 A1 * | 1/2003 | Park | H01L 27/0805 |
| | | | 438/393 |
| 2004/0002188 A1 * | 1/2004 | Chung | H01L 28/75 |
| | | | 438/240 |
| 2004/0104420 A1 * | 6/2004 | Coolbaugh | H01L 28/55 |
| | | | 257/310 |

(Continued)

FOREIGN PATENT DOCUMENTS

| | | |
|---|---|---|
| EP | 0681327 A2 | 11/1995 |
| JP | 06342850 A | 12/1994 |

*Primary Examiner* — Whitney T Moore
*Assistant Examiner* — Joseph Galvin, III
(74) *Attorney, Agent, or Firm* — Steven J. Meyers; Hoffman Warnick LLC

(57) ABSTRACT

Embodiments disclose a method of fabrication and a semiconductor structure comprising a Metal-insulator-metal (MIM) capacitor. The method of fabrication includes depositing a first conductive material on a semiconductor substrate. A first dielectric material is deposited on the first conductive material. A second conductive material is deposited on the first dielectric material. The top plate is formed by etching the second conductive material. The bottom plate is formed by etching a portion of the first conductive material. At least one opening is formed in the first dielectric layer down to the first conductive material.

11 Claims, 5 Drawing Sheets

(56) References Cited

U.S. PATENT DOCUMENTS

| | | | | |
|---|---|---|---|---|
| 2004/0259378 A1* | 12/2004 | Chambers | H01L 21/76886 | 438/771 |
| 2005/0072973 A1* | 4/2005 | Kim | H01L 29/4908 | 257/59 |
| 2005/0139956 A1* | 6/2005 | Ohkubo | H01L 23/5223 | 257/532 |
| 2005/0272219 A1* | 12/2005 | Coolbaugh | H01L 23/5223 | 438/396 |
| 2008/0253925 A1* | 10/2008 | Xue | B22D 21/007 | 420/550 |
| 2009/0267187 A1* | 10/2009 | Hose | H01L 28/75 | 257/535 |
| 2010/0079929 A1* | 4/2010 | Smeys | H01G 9/0032 | 361/524 |
| 2011/0133666 A1* | 6/2011 | Arai | H01L 27/1214 | 315/291 |
| 2012/0001298 A1* | 1/2012 | Sakurai | B82Y 30/00 | 257/532 |
| 2012/0044611 A1* | 2/2012 | Edelstein | H01G 7/026 | 361/278 |
| 2014/0246777 A1* | 9/2014 | Levy | H01L 21/76883 | 257/773 |
| 2014/0353675 A1* | 12/2014 | Nishii | H01L 21/28264 | 257/76 |
| 2015/0035117 A1* | 2/2015 | Adderly | H01L 28/40 | 257/532 |

* cited by examiner

SEMICONDUCTOR DEVICE WITH METAL EXTRUSION FORMATION

BACKGROUND OF THE INVENTION

The present invention relates generally to the fabrication of semiconductor devices, and more particularly to an annealed metal layer of a metal-insulator-metal (MIM) capacitor structure and a related method.

Metal-insulator-metal (MIM) capacitors are valuable components in memory, logic and analog circuits. For example, MIM capacitors may be used in mixed signal integrated circuits (IC) such as analog frequency tuning circuits, switched capacitor circuits, filters, up-conversion mixers, down-conversion mixers, and A/D converters.

MIM capacitors are semiconductor devices that may be fabricated on a bulk semiconductor substrate or on a silicon-on-insulator (SOI) substrate. MIM capacitor devices generally consist of a top metal plate, an insulating layer called a dielectric, and a bottom metal plate. MIM capacitor devices may be connected to other semiconductor devices on the same substrate, such as transistors in an integrated circuit, through multiple wiring levels. An applied potential charges the top and bottom plates until both are at the same potential as the source of the potential. When the source is removed from the integrated circuit, the capacitor will discharge and cause a current to flow in the integrated circuit.

SUMMARY

Embodiments of the present invention disclose a method of fabrication and a semiconductor structure comprising a Metal-insulator-metal (MIM) capacitor. The method of fabrication includes depositing a first conductive material on a semiconductor substrate, wherein the first conductive material is a bottom plate of a MIM capacitor. A first dielectric material is deposited on the first conductive material, wherein the first dielectric material is an insulating layer of the MIM capacitor. A second conductive material is deposited on the first dielectric material, wherein the second conductive material is a top plate of the MIM capacitor. The top plate is formed by etching the second conductive material down to the first dielectric material. The bottom plate is formed by etching a portion of the first dielectric material and a resulting exposed portion of the first conductive material down to the semiconductor substrate. At least one opening is formed in the first dielectric layer down to the first conductive material.

Embodiments of the present invention disclose a semiconductor structure comprising a Metal-insulator-metal (MIM) capacitor formed on a substrate, having a top plate, a bottom plate, and a dielectric layer. The bottom plate includes a first conductor formed on the substrate, the dielectric layer includes an insulating layer formed on the first conductor, and the top plate includes a second conductor formed on the dielectric layer. The first conductor has an exposed portion of a top surface and an exposed portion of a side surface during an annealing process.

DETAILED DESCRIPTION

Figure 1:
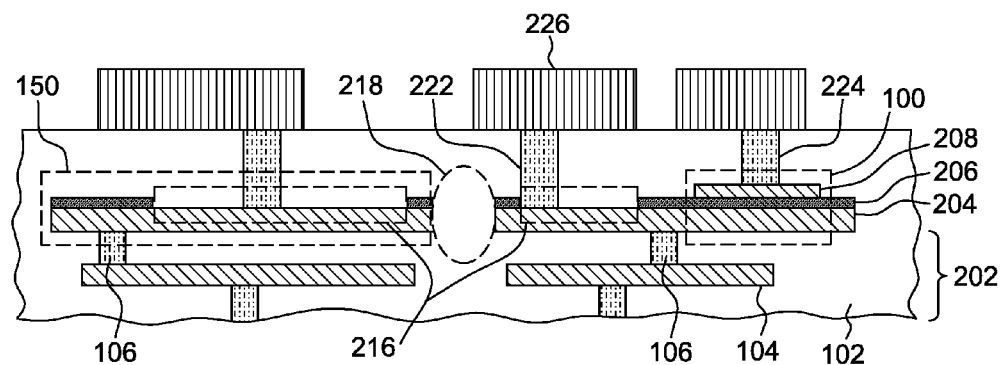
FIG. 1 illustrates a cross-sectional view of a semiconductor device, in accordance with an embodiment of the present invention.

Semiconductor devices such as back-end-of-line (BEOL) metal-insulator-metal (MIM) capacitors are important devices used in radio frequency, analog, and mixed-signal integrated circuit (IC) applications. MIM capacitors may be used to store energy, and to filter or condition the current flowing within an integrated circuit. Embodiments, in accordance with the present invention, recognize that a combination of materials, structural elements, and processing steps used in fabrication of MIM capacitors create lateral extrusions between metal sidewalls of the metal layers causing defects or electrical shorts. Embodiments provide a fabrication process for a MIM capacitor which selectively removes portions of the insulating or dielectric layer above the bottom plate of the MIM capacitor. The dielectric layer is removed utilizing an etch mask during a dielectric etch process, and prior to the metal annealing process. The mask design is created based, at least in part, on tolerances for photolithography registration of photo mask openings to underlying features. Removal of the dielectric layer above the bottom plate relieves compressive stresses in the metal layer to reduce the formation of lateral extrusion defects, and provides defined areas of the metal layers which are allowed to form vertical extrusions, or hillocks, during the metal annealing process.

Embodiments define a MIM capacitor structure with a top conductive layer, an insulating dielectric layer, and a bottom conductive layer, where each layer is parallel to each other. Embodiments of the present invention recognize that current solutions for yielding MIM capacitors with reduced extrusion-related defects require the spacing between shapes formed from a conductive layer to be greater than the extrusion length of the material comprising the conductive layer. For example, building BEOL MIM capacitors with spacing less than 5 microns between conductive shapes in an aluminum layer creates a yield loss for shorts or near-shorts between the conductive shapes. Embodiments provide for building a MIM capacitor on a semiconductor substrate with reduced lateral extrusion defects while allowing the spacing between shapes formed from the conductive layer to be less than the extrusion length of the material comprising the conductive layer. Building a MIM capacitor with metal-to-metal spacing less than the extrusion length of the conductive material utilizes a process for etching wide areas of the MIM insulating layer providing areas for subsequent vertical hillock formation during the annealing process. Fabrication methods are disclosed for etching wide areas of the MIM insulating layer. Reduced extrusion-related defects combined with reduced spacing between shapes formed from a conductive layer offer the potential to deliver superior performance for semiconductor applications in electronic devices.

Embodiments define an annealed metal wire structure with a conductive layer and an insulating dielectric layer, where portions of the dielectric layer are removed from the surface of the conductive layer to allow for vertical hillock formation during the annealing process, and to reduce lateral extrusions between sidewalls of shapes formed from the conductive layer.

Embodiments generally provide a BEOL MIM capacitor device with reduced lateral extrusion defects between metal conductors permitting reproducible and manufacturable designs with metal spacing less than or equal to the extrusion length of the metal. Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the Figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing Figures. The terms "on", "over", "overlying", "atop", "positioned on", or "positioned atop" mean that a first element, such as a first structure, is present on a second element, such as a second structure, wherein intervening elements, such as an interface structure may be present between the first element and the second element. The terms "direct contact", "directly on", or "directly over" mean that a first element, such as a first structure, and a second element, such as a second structure, are connected without any intermediary conducting, insulating or semiconductor layers at the interface of the two elements. The terms "connected" or "coupled" mean that one element is directly connected or coupled to another element, or intervening elements may be present. The terms "directly connected" or "directly coupled" mean that one element is connected or coupled to another element without any intermediary elements present.

Structure

Referring now to the Figures, FIG. 1 illustrates a cross-sectional view of a semiconductor device, in accordance with an embodiment of the present invention. FIG. 1 illustrates a portion of a semiconductor device containing a back-end-of-line (BEOL) metal-insulator-metal (MIM) capacitor, i.e. MIM capacitor 100, with lower wiring layers in substrate 202 below MIM capacitor 100, and upper wiring layers leading to the surface above MIM capacitor 100. MIM capacitor 100 includes at least conductive material 208, dielectric layer 206, and conductive material 204. The top plate (not shown) and bottom plate (not shown) of MIM capacitor 100 are comprised of portions of conductive material 208 and conductive material 204, respectively. Dielectric layer 206 is comprised of an insulating material, such as silicon nitride ("$Si_3N_4$"). In accordance with an embodiment of the present invention, portions of dielectric layer 206 are selectively removed in locations 216 to prevent formation of lateral metal extrusions between segments of conductive material 204 in location 218 during the annealing process. Removal of portions of dielectric layer 206 provides a reduction in compressive stress on conductive material 204 allowing formation of vertical extrusions in locations 216 during the annealing process.

The lower wiring layers are represented by conductive material 104, and vias 106, but one skilled in the art will understand that many more wiring layers including front-end-of-line devices (not shown), such as transistors, may exist in the substrate below MIM capacitor 100. The upper wiring layers, or escape wiring leading to the surface above MIM capacitor 100, are represented by vias 222 and 224, and conductive material 226. The wiring layers are built within and atop a semiconductor material, such as semiconducting material 102. Above the upper wiring layers, there may be protective layers (not shown), such as oxides, nitrides, and polyimide films, as are standard in semiconductor manufacture.

FIG. 1 also illustrates a portion of a semiconductor device containing an annealed metal layer, i.e. wire 150, with lower wiring layers in substrate 202 below wire 150, and upper wiring layers leading to the surface above wire 150. Wire 150 comprises conductive material 204. Directly above conductive material 204, is dielectric layer 206 comprised of an insulating material, such as silicon nitride ("$Si_3N_4$"). In accordance with an embodiment of the present invention, portions of dielectric layer 206 are selectively removed in locations 216 to prevent formation of lateral metal extrusions between shapes formed in conductive material 204 in location 218 during the annealing process. Removal of portions of dielectric layer 206 provides a reduction in compressive stress on conductive material 204 allowing formation of vertical extrusions in locations 216 during the annealing process.

Method

Figure 2A:
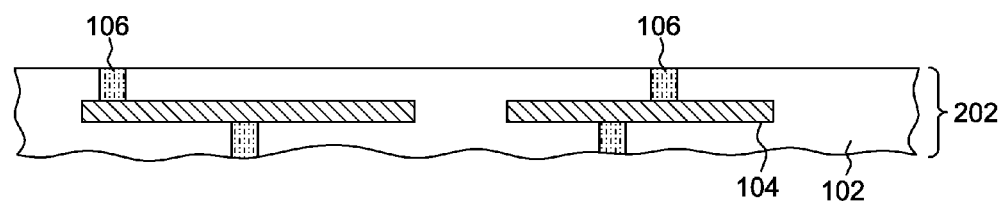
FIG. 2A is a cross-sectional view of a semiconductor substrate upon which the semiconductor device of FIG. 1 may be fabricated, in accordance with embodiments of the present invention.

FIGS. 2A-2K depict an embodiment for fabricating an annealed metal layer within both MIM capacitor 100 and wire 150. FIG. 2A is a cross-sectional view of a semiconductor substrate upon which the semiconductor device of FIG. 1 may be fabricated, in accordance with embodiments of the present invention. Substrate 202 may include a semiconductor substrate, e.g., silicon, GaAs, silicon-on-insulator (SOI), may include lower level metal wiring layers in inter-layer dielectric materials, or both. In the illustrative example of FIG. 2A, a portion of the lower level wiring layer is represented by conductive material 104, and vias 106, embedded in semiconducting material 102. In embodiments, conductive material 104 and vias 106 are comprised of Al or Cu formed using conventional damascene patterning or subtractive etch patterning utilizing lithographic, etching and deposition processes, which require no further explanation for those of skill in the art to understand. Substrate 202 may include an electrically semiconducting material, an insulating material, a conductive material, devices, or structures made of these materials or any combination thereof (e.g., a lower level of an interconnect structure). In certain embodiments, substrate 202 is comprised of semiconducting material 102, such as Si, SiGe, SiGeC, SiC, Ge alloys, GaAs, InAs, InP, and other compound semiconductors, or organic semiconductors. In addition to the above listed semiconducting materials, semiconducting material 102 may also be a layered semiconductor, such as, for example, Si/SiGe, Si/SiC, SOIs, or silicon germanium-on-insulators (SGOIs). These semiconductor materials may form a device, devices, or structures, which may be discrete or interconnected.

In certain embodiments, substrate 202 includes one or more semiconductor devices, such as complementary metal oxide semiconductor (CMOS) devices or other field effect transistors (FETs), strained silicon devices, carbon-based (carbon nanotubes and/or graphene) devices, phase-change memory devices, magnetic memory devices, magnetic spin switching devices, single electron transistors, quantum devices, molecule-based switches, and other switching or memory devices that can be part of an integrated circuit formed therein. In other embodiments, substrate 202 includes an electrical insulating material, such as an organic insulator, an inorganic insulator, or a combination thereof. Substrate 202 can include electrically conducting material, for example, polysilicon, an elemental metal, an alloy including at least one elemental metal, a metal silicide, a metal nitride, etc., or combinations thereof including multilayers.

Figure 2B:
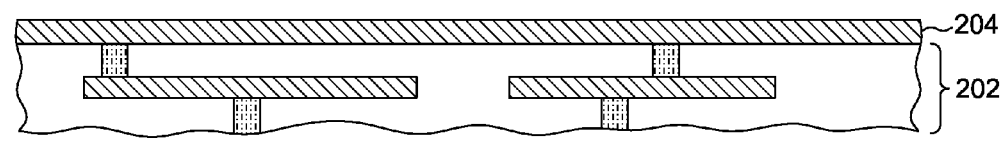
FIG. 2B depicts fabrication steps, in accordance with an embodiment of the present invention.

FIG. 2B depicts fabrication steps, in accordance with an embodiment of the present invention. Conductive material 204 is deposited over the surface of substrate 202. A portion of conductive material 204 forms the bottom plate (not shown) of MIM capacitor 100 and at the same time forms wire 150 (not shown). Conductive material 204 may be comprised of one or more of Cu, Al, W, Ti, TiN, or any other useful conductive material or alloy(s). Conductive material 204 is deposited using an appropriate deposition technique, such as sputter deposition, electrochemical deposition (ED), electroplating, CVD, ALD, or other deposition techniques. In various embodiments, conductive material 204 is a multi-layer composition of Ti, Al (doped with Cu), and TiN.

For example, a first layer of Ti is deposited with a typical thickness of about 13 nm to 15 nm. A layer of Al doped with Cu is deposited over the first layer of Ti with a typical thickness of about 480 nm. In other embodiments, the Al doped with Cu layer may range 50 nm to 6000 nm. Al is doped with Cu in CMOS devices to improve electromigration performance. The Cu concentration within the Al is typically 0.5% w/w. A second layer of Ti is deposited over the Al layer with a typical thickness of 13 nm to 15 nm. A layer of TiN is deposited over the second layer of Ti with a typical thickness of 32 nm, which may range+/−10%. A person of ordinary skill in the art will recognize that the thickness of the Al layer is dependent on factors such as the technology being built, and the line width and spacing of the conductive shapes or wires formed from the Ti/Al/Ti layer.

Thinner Al layers will enable finer spacing between lines or wires. In CMOS technology, the two Ti/Al interfaces will form redundant layers of TiAl$_3$ above and below the Al layer after an annealing process. The TiAl$_3$ is a compound exhibiting refractory properties and provides an electrical path for current flow in circuits formed within conductive material 204, even if voids form in the Al portion. The TiN layer is used to reduce the reflectiveness of both the Al and Ti layer for better performance during the expose portion of a subsequent photolithography process.

Figure 2C:
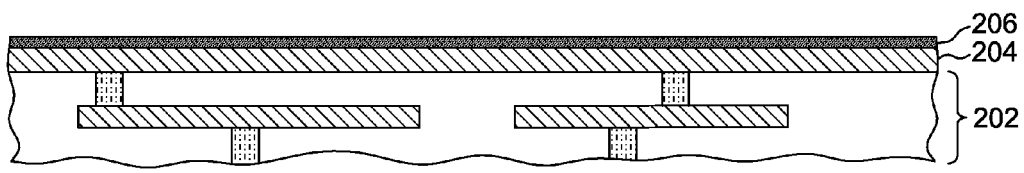
FIG. 2C depicts additional fabrication steps, in accordance with an embodiment of the present invention.

FIG. 2C depicts fabrication steps, in accordance with an embodiment of the present invention. Dielectric layer 206 may be formed over the surface of conductive material 204 using an appropriate deposition technique, such as physical vapor deposition (PVD), plasma assisted chemical vapor deposition (PACVD), chemical vapor deposition (CVD), plasma enhanced chemical vapor deposition (PECVD), low pressure chemical vapor deposition (LPCVD), atomic layer deposition (ALD), chemical solution deposition (such as spin coating), or evaporation. Dielectric layer 206 may comprise dielectric material including, but not limited to: SiC, Si$_3$N$_4$, SiO$_2$, a carbon doped oxide, a nitrogen and hydrogen doped silicon carbide SiC(N,H), a low-K dielectric, or multilayers thereof. Dielectric layer 206 properties, such as material and thickness, are selected to provide reduced parasitic capacitance with nearby conductive structures. In various embodiments, dielectric layer 206 is Si$_3$N$_4$ with a typical thickness of about 50 nm and may range up to about 300 nm. A person of ordinary skill in the art will recognize that chemical-mechanical planarization (CMP) steps may be inserted after the dielectric deposition process to planarize the surface of dielectric layer 206. CMP may use a combination of chemical etching and mechanical polishing to smooth the surface and even out any irregular topography.

Figure 2D:
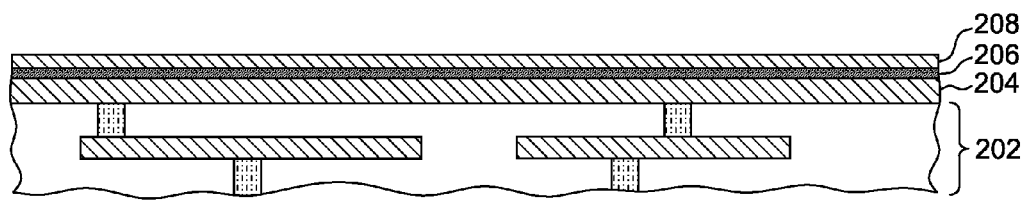
FIG. 2D depicts additional fabrication steps, in accordance with an embodiment of the present invention.

FIG. 2D depicts additional fabrication steps, in accordance with an embodiment of the present invention. Conductive material 208 may be deposited on dielectric layer 206 using an appropriate deposition technique (discussed above). Conductive material 208 may include Cu, Al, W, Ti, TiN, or any other useful conductive material or alloys. Conductive material 208 may be deposited using CVD or other deposition techniques. In various embodiments, conductive material 208 is a multi-layer composition of TiN, and Al (doped with Cu).

For example, a first layer of TiN is deposited with a typical thickness of about 10 nm. A layer of Al doped with Cu is deposited over the first layer of TiN with a typical thickness of about 200 nm. In other embodiments, the Al doped with Cu layer may range 50 nm to 6000 nm. A second layer of TiN is deposited over the Al layer with a typical thickness of 32 nm, which may range+/−10%. As above, the top TiN layer is used to reduce the reflectiveness of the Al layer for better performance during the expose portion of a subsequent photolithography process. The bottom TiN layer acts as a refractory metal providing an electrical path for current flow in circuits formed within conductive material 208, even if voids form in the Al portion.

Figure 2E:
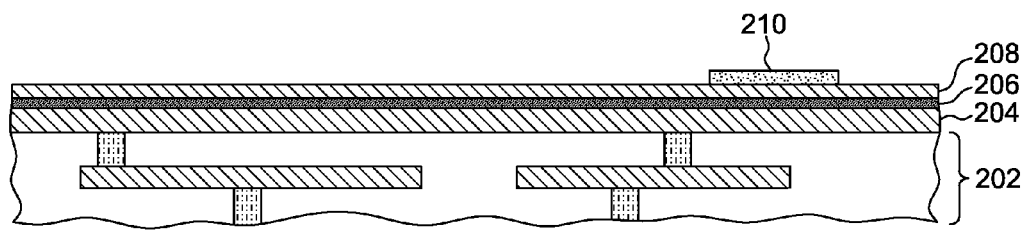
FIG. 2E depicts additional fabrication steps, in accordance with an embodiment of the present invention.

FIG. 2E depicts additional fabrication steps, in accordance with an embodiment of the present invention. Using a conventional lithography process, etch mask 210 is deposited over conductive material 208, and then patterned to create an etch mask over a portion of conductive material 208 which defines the top plate (not shown) of MIM capacitor 100.

Figure 2F:
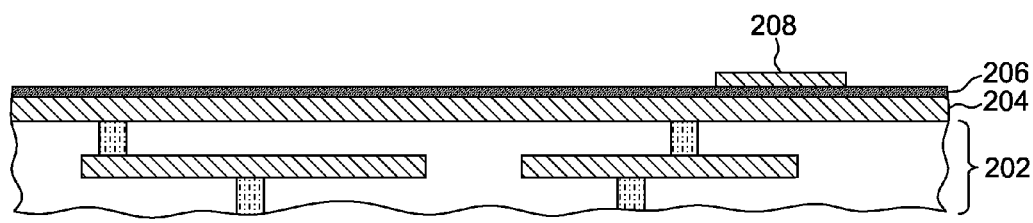
FIG. 2F depicts additional fabrication steps, in accordance with an embodiment of the present invention.

FIG. 2F depicts additional fabrication steps, in accordance with an embodiment of the present invention. In one embodiment using etch mask 210, portions of conductive material 208 which are not under etch mask 210 are etched down to dielectric layer 206, forming the top plate of MIM capacitor 100 (not shown). Conductive material 208 is etched by employing a reactive ion etch (RIE) or similar process. RIE uses chemically reactive plasma, generated by an electromagnetic field, to remove various materials. A person of ordinary skill in the art will recognize that the type of plasma used will depend on the material being removed, or that other etch processes, e.g., wet chemical etch, laser ablation, etc., may be used. In another embodiment, subsequent to the removal of the portions of conductive material 208, a portion of dielectric layer 206 is removed during the etch process. Subsequent to the etching, etch mask 210 and the top TiN layer is removed from the top plate of MIM capacitor 100 using a standard etch process.

Figure 2G:
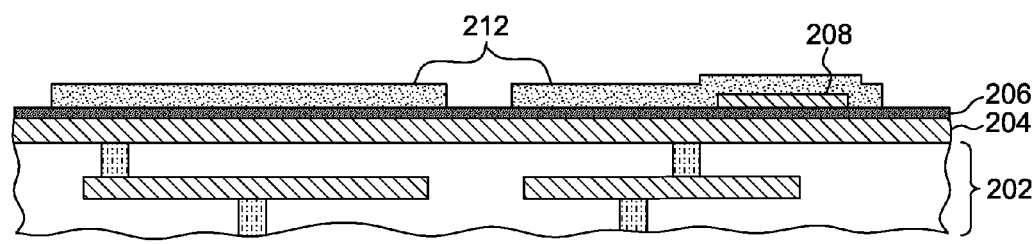
FIG. 2G depicts additional fabrication steps, in accordance with an embodiment of the present invention.

FIG. 2G depicts additional fabrication steps, in accordance with an embodiment of the present invention. Using a conventional lithography process, etch mask 212 is deposited over conductive material 208 (the top plate) and dielectric layer 206, and then patterned to create an etch mask over at least one portion of conductive material 208 and dielectric layer 206, which defines the bottom plate (not shown) of MIM capacitor 100 and other wires in conductive material 204.

Figure 2H:
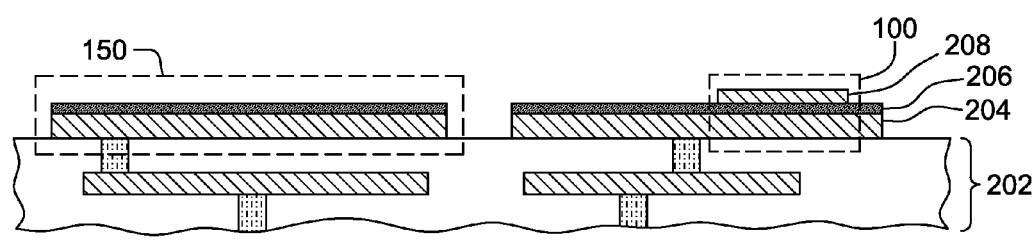
FIG. 2H depicts additional fabrication steps, in accordance with an embodiment of the present invention.

FIG. 2H depicts additional fabrication steps, in accordance with an embodiment of the present invention. In one embodiment, using etch mask 212, portions of dielectric layer 206 and conductive material 204 which are not under etch mask 212 are etched down to semiconducting material 102 of substrate 202 forming at least the bottom plate of MIM capacitor 100, and wire 150. The bottom plate is preferably formed by employing a reactive ion etch (RIE) or using an appropriate etching technique (discussed above). In another embodiment, subsequent to the removal of portions of dielectric layer 206 and portions of conductive material 204, a portion of semiconducting material 102 of substrate 202 is removed during the etch process. Subsequent to the etching, etch mask 212 is removed from conductive material 208, or the top plate of MIM capacitor 100, and from dielectric layer 206 using a standard resist strip process. FIG. 2H illustrates MIM capacitor 100 with an outline surrounding the top plate in conductive material 208, a portion of dielectric layer 206, and a portion of the bottom plate in conductive material 204.

Figure 2I:
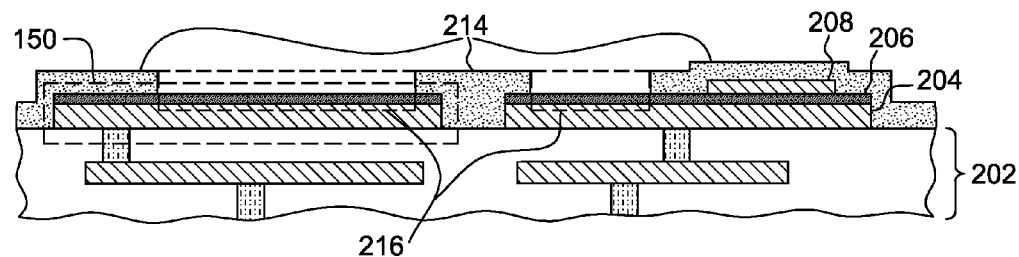
FIG. 2I depicts additional fabrication steps, in accordance with an embodiment of the present invention.

FIG. 2I depicts additional fabrication steps, in accordance with an embodiment of the present invention. Using a conventional lithography process, etch mask 214 is deposited over conductive material 208 (the top plate), dielectric layer 206, and exposed portions of substrate 202. Etch mask 214 is then patterned to create an etch mask which defines portions of dielectric layer 206 to be removed at locations 216, in accordance with an embodiment of the present invention. In other embodiments, etch mask 214 may be deposited in a pattern (rather than blanket deposited) using conventional lift-off lithography methods. A person of ordinary skill in the art will recognize that the type of lithography used will depend on the material being deposited and patterned, the thickness of the material being deposited, and the spacing requirements between lines. Embodiments provide for the selection of an etch mask material that balances the advantage of low material cost with a suitable range of variability in registration of etch mask 214 to the surface of dielectric layer 206. Details of etch mask 214 are depicted and described in further detail with respect to FIG. 4.

Figure 2J:
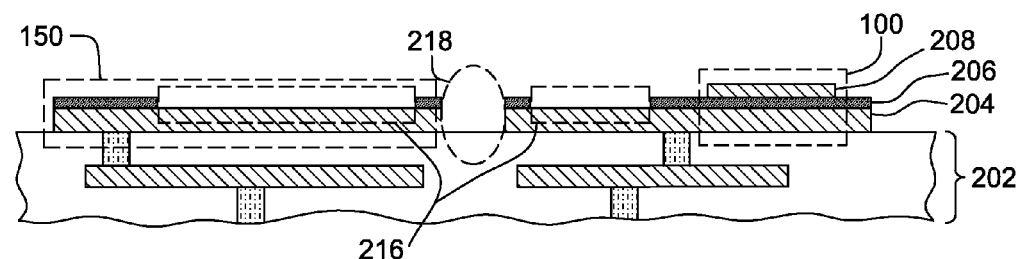
FIG. 2J depicts additional fabrication steps, in accordance with an embodiment of the present invention.

FIG. 2J depicts additional fabrication steps, in accordance with an embodiment of the present invention. In one embodiment, using etch mask 214, portions of dielectric layer 206 which are not under etch mask 214 are etched down to conductive material 204 in locations 216. Portions of dielectric layer 206 are preferably removed by employing an anisotropic reactive ion etch (RIE) or using an appropriate etching technique (discussed above). In one embodiment, dielectric layer 206 is $Si_3N_4$, and the etching technique is a standard nitride etch endpointed by exhaust chemistry sensors. Subsequent to the etching, etch mask 214 is removed from conductive material 208 (the top plate), dielectric layer 206, and portions of substrate 202 using a standard resist strip process. FIG. 2J illustrates MIM capacitor 100 and portions of conductive material 204 forming wire 150 where dielectric layer 206 was removed in locations 216.

Subsequent to the removal of etch mask 214, substrate 202 and the fabricated layers of conductive material 204, dielectric layer 206, and conductive material 208 are annealed utilizing heat treatments of the semiconductor structure in air or controlled gas environments. For example, a typical annealing process includes temperatures of 400 C for 20 minutes in forming gas (a mixture of $H_2$ and $N_2$ gases). In the illustrative example of FIG. 2J, the annealing process forms $TiAl_3$ from the layers of Ti above and below the layer of Al comprising conductive material 204. An initial structure of 13 nm Ti/482 nm Al/13 nm Ti becomes a structure of 47 nm $TiAl_3$ /409 nm Al/47 nm $TiAl_3$ after the annealing process.

The dominant driving force for lateral and vertical extrusion formation is the large difference in thermal expansion coefficients between conductive material 204, such as Al, and the silicon in substrate 202. The larger the overall area of conductive material 204, the more likely it is that lateral extrusions will form between conductor sidewalls. The tighter the spacing between conductor wires, the more likely it is that lateral extrusions will form shorts or near-shorts between conductor sidewalls. By removing the compressive stress on portions of the top surface of conductor 204, vertical extrusions are allowed to form. Since it is easier to form the vertical extrusions, the lateral extrusions do not form before the stress is dissipated. Embodiments provide MIM capacitor 100 and wire 150 with sidewalls of conductive material 204 sufficiently free of extrusions to avoid shorts and near-shorts. Responsive to the annealing process, the exposed portion of the sidewall or side surface of conductive material 204 in location 218 is free of lateral extrusions, and the exposed portion of the top surface of conductive material 204 includes one or more extrusions in the top surface of the conductor in locations 216.

Figure 2K:
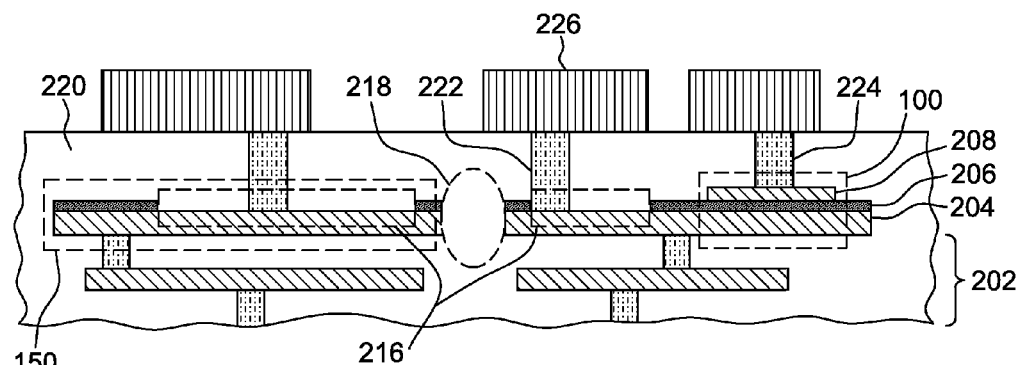
FIG. 2K depicts additional fabrication steps, in accordance with an embodiment of the present invention.

FIG. 2K depicts additional fabrication steps, in accordance with an embodiment of the present invention. Additional wiring layers are fabricated above MIM capacitor 100 and wire 150. In embodiments, conductive material 226 and vias 222 and 224, are each comprised of Pd, Al or Cu, with a typical thickness of about 4000 nm, embedded in an inter-layer dielectric, such as semiconducting material 220, and formed using conventional damascene patterning or subtractive etch patterning utilizing lithographic, etching and deposition processes such that no further explanation is required herein for those of skill in the art to understand the invention. Semiconducting material 220 may be the same or a complementary semiconducting material as semiconducting material 102, as discussed above. Vias 222 and 224 may each, respectively, provide electrical connection with the bottom plate, and top plate of MIM capacitor 100 to the surface of the semiconductor product for wiring purposes. One skilled in the art will recognize that additional cleaning processes may be necessary before creating the additional wiring layers. In some embodiments, a passivation layer, a dielectric capping layer, or a protective coating, such as SiN or $SiO_2$, may be deposited (not shown) on surface wires of conductive material 226 to protect the metal surface from environmental conditions. In some embodiments, a polyimide layer may be deposited (not shown) on top of the dielectric capping layer with openings for solder connections.

Figure 3:
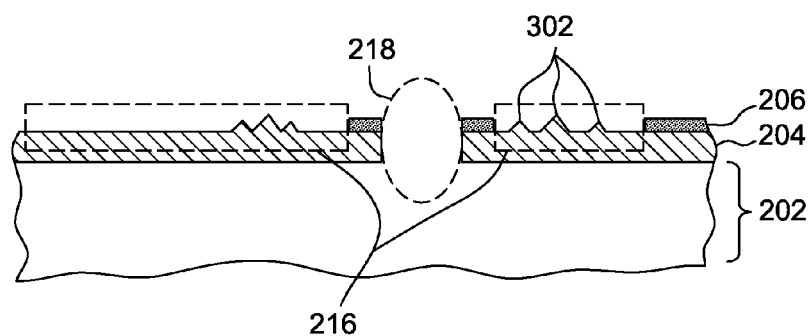
FIG. 3 is a cross-sectional view of a MIM capacitor conductive layer after annealing with a removed dielectric layer in the semiconductor device of FIG. 1, in accordance with an embodiment of the present invention.

FIG. 3 is a cross-sectional view of a MIM capacitor conductive layer after annealing with a removed dielectric layer in the semiconductor device of FIG. 1, in accordance with an embodiment of the present invention. Portions of dielectric layer 206 were selectively removed in locations 216 prior to the annealing process, in accordance with an embodiment of the present invention. The portions of conductive material 204 in locations 216, which are free of dielectric layer 206, exhibit lowered compressive stress on conductive material 204 during annealing compared to areas covered with dielectric layer 206. During the annealing process, the lower compressive stress allows the formation of vertical extrusions 302 in locations 216, which is not considered a yield or reliability problem. The ability to form vertical extrusions reduces formation of lateral extrusions in location 218, and increases the overall yield of semiconductor product.

Embodiments recognize that during annealing conductive material 204 is expanding in all directions, and the portions of conductive layer 204 covered by dielectric layer 206 exhibit compressive stresses on the covered portions of conductive material 204, thereby preventing vertical extrusions, and allowing lateral extrusions (not shown). The lateral metal extrusions form shorts which reduce the yields of the semiconductor product. Lateral metal extrusions may also form near-shorts which may later become reliability concerns and shorten the life of the semiconductor product.

Figure 4:
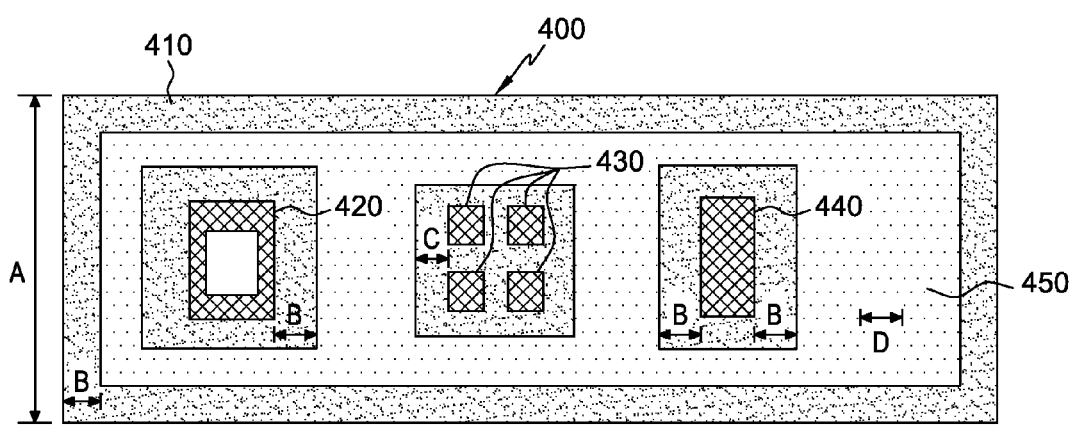
FIG. 4 illustrates a top-down view of a photolithography etch mask for removing a dielectric layer, in accordance with an embodiment of the present invention.

FIG. 4 illustrates a top-down view of a photolithography etch mask 400 for removing a dielectric layer, in accordance with an embodiment of the present invention. Embodiments provide for the formation of an etch mask with a low cost registration budget for registering etch mask 214 to the surface of dielectric layer 206, as depicted and described in FIG. 2I. Etch mask 400 illustrates a photolithography etch mask for a portion of a semiconductor device where a set of rules are applied to reduce registration errors while maximizing the open areas for etching.

Width A, as seen in FIG. 4, indicates the width of a wire in a conductive material, such as conductive material 204 as depicted and described in FIG. 2I. An opening in etch mask 400 may be formed for a wire greater than 5 microns (5 micrometers, or 5000 nm) in width. Wires narrower than 5 microns typically do not possess enough metal in conductive material 204 to create lateral extrusions during annealing.

An edge of an opening in etch mask 400 stops within a guard band distance from a perimeter of the wire. A portion of etch mask 400 inside the perimeter of the wire edge stops within the guard band distance from a perimeter of an opening inside the wire, such as for surface pads. In the illustration of FIG. 4, etch mask 400 is formed with a 1 micron protective guard band, shown as width B, around the perimeter of the wire edge, as in band 410, and around surface pads, such as pads 420 and 440.

A portion of etch mask 400 inside the perimeter of the wire covers at least one via with an additional 0.75 micron width of etch mask beyond the associated surface land. In the illustration, etch mask 400 is formed with a protective band, shown as width C, around vias 430. In the illustration of FIG. 4, the protective band measures the width of the surface land of each via plus 0.75 micron. Any portion of the etch mask inside the perimeter of the wire is at least 0.4 micron wide due to limitations of the mask and etch process. In the case where the previous rules create a sliver of protective band, shown as width D, measuring less than or equal to 0.4 micron, the protective band is removed from the design of etch mask 400, as in location 450.

In one embodiment, etch mask 400 may be generated manually, and in other embodiments, etch mask 400 may be generated through design software, such as electronic computer-aided design, by a circuit designer or developer. The above rules may be programmed into the design software. One skilled in the art will recognize that registration rules may be loosened or tightened based on the requirements of the technology being built. The rules illustrated are not meant to be a complete list of requirements for building an etch mask, but serve as an illustration of possible values for key measurements. In other embodiments, widths A, B, C, and D may be larger or smaller based, at least in part, on the expansion properties of conductive material 204, and the minimum line width spacing between segments of conductive material 204.

Having described embodiments for an annealed metal layer within MIM capacitor devices and methods of fabrication having reduced lateral shorts between conductive sidewalls (which are intended to be illustrative and not limiting), it is noted that modifications and variations may be made by persons skilled in the art in light of the above teachings. It is, therefore, to be understood that changes may be made in the particular embodiments disclosed which are within the scope of the invention as outlined by the appended claims.

In certain embodiments, the fabrication steps depicted above may be included on a semiconductor substrate consisting of many devices and one or more wiring levels to form an integrated circuit chip. The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed:

1. A method of fabricating a semiconductor structure comprising an annealed metal layer, the method comprising:

depositing a first conductive material on a semiconductor substrate;

depositing a first dielectric material on the first conductive material;

patterning an etch mask comprising at least one etch mask opening over the first dielectric layer and the first conductive material, wherein the etch mask includes the at least one etch mask opening and wherein the first conductive material forms a wire;

forming at least one opening in the first dielectric layer down to the first conductive material; and forming vertical extrusions in the first conductive material within the at least one opening in the first dielectric layer.

2. The method of claim 1, further comprising:

depositing a second conductive material on the first dielectric material, wherein the second conductive material is a top plate of a MIM capacitor;

forming the top plate of the MIM capacitor comprising etching the second conductive material down to the first dielectric material;

forming an insulating layer of the MIM capacitor comprising etching the first dielectric material down to the first conductive material; and forming a bottom plate of the MIM capacitor comprising etching a portion of the first dielectric material and a resulting exposed portion of the first conductive material down to the semiconductor substrate.

3. The method of claim 1, wherein forming the at least one opening in the first dielectric layer includes forming the at least one opening down to a portion of the first conductive material, wherein the portion of the first conductive material is the wire.

4. The method of claim 1, wherein the etch mask further includes:

an edge of the at least one etch mask opening stops within a guard band distance from a perimeter of the wire; and a portion of the etch mask inside the perimeter of the wire stops within the guard band distance from a perimeter of an opening inside the wire, wherein the wire is greater than 5 microns wide.

5. The method of claim 4, wherein the etch mask further includes:

a first portion of the etch mask inside the perimeter of the wire that covers at least one via land with an additional 0.75 micron width of etch mask; and a second portion of the etch mask inside the perimeter of the wire that is at least 0.4 micron wide.

6. The method of claim 4, wherein the guard band distance is 1 micron.

7. The method of claim 1, wherein the first conductive material forms a layer of $TiAl_3$ after an annealing process.

8. The method of claim 1, wherein the first conductive material comprises at least one layer comprising one or more of: Cu, Al, Al doped with Cu, W, Ti, and TiN.

9. The method of claim 1, wherein the second conductive material comprises at least one layer comprising one or more of: Cu, Al, Al doped with Cu, W, Ti, and TiN.

10. The method of claim 1, wherein the first dielectric layer comprises at least one of: SiC, $SiN_4$, $SiO_2$, and a low-K dielectric.

11. The method of claim 1, further comprising:

depositing an inter-layer dielectric over the MIM capacitor;

forming a first contact in the inter-layer dielectric, the first contact connecting the top plate of the MIM capacitor;

forming a second contact in the inter-layer dielectric, the second contact connecting the bottom plate of the MIM capacitor; and forming a wiring layer over the first contact and the second contact.

* * * * *